(12) United States Patent
Hung et al.

(10) Patent No.: US 8,921,226 B2
(45) Date of Patent: Dec. 30, 2014

(54) METHOD OF FORMING SEMICONDUCTOR STRUCTURE HAVING CONTACT PLUG

(71) Applicant: United Microelectronics Corp., Hsin-Chu (TW)

(72) Inventors: Ching-Wen Hung, Tainan (TW); En-Chiuan Liou, Tainan (TW); Chih-Sen Huang, Tainan (TW); Po-Chao Tsao, New Taipei (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 98 days.

(21) Appl. No.: 13/740,289

(22) Filed: Jan. 14, 2013

(65) Prior Publication Data

US 2014/0199837 A1 Jul. 17, 2014

(51) Int. Cl.
*H01L 21/768* (2006.01)

(52) U.S. Cl.
CPC ............................... *H01L 21/76879* (2013.01)
USPC ........................................................ 438/675

(58) Field of Classification Search
None
See application file for complete search history.

(56) References Cited

U.S. PATENT DOCUMENTS

| | | | |
|---|---|---|---|
| 5,314,845 A | 5/1994 | Lee | |
| 5,362,526 A | 11/1994 | Wang | |
| 5,387,546 A | 2/1995 | Maeda | |
| 6,015,759 A | 1/2000 | Khan | |
| 6,037,237 A | 3/2000 | Park | |
| 6,074,946 A | 6/2000 | Ouellet | |
| 6,103,601 A | 8/2000 | Lee | |
| 6,153,530 A | 11/2000 | Ye | |
| 6,162,587 A | 12/2000 | Yang | |
| 6,380,096 B2 | 4/2002 | Hung | |
| 6,426,285 B1 | 7/2002 | Chen | |
| 6,465,352 B1 | 10/2002 | Aoki | |
| 6,573,176 B2 | 6/2003 | Hong | |
| 6,605,545 B2 | 8/2003 | Wang | |
| 6,638,871 B2 | 10/2003 | Wang | |
| 6,649,531 B2 | 11/2003 | Cote | |
| 6,696,222 B2 | 2/2004 | Hsue | |
| 6,720,132 B2 | 4/2004 | Tsai | |
| 6,797,627 B1 | 9/2004 | Shih | |

(Continued)

OTHER PUBLICATIONS

Hung et al., Title: Semiconductor Structure Having Contact Plug and Method of Making the Same, pending U.S. Appl. No. 13/705,175, filed Dec. 5, 2012.

(Continued)

*Primary Examiner* — Charles Garber
*Assistant Examiner* — Stanetta Isaac
(74) *Attorney, Agent, or Firm* — Winston Hsu; Scott Margo

(57) ABSTRACT

A method of forming a semiconductor structure having at least a contact plug includes the following steps. At first, at least a transistor and an inter-layer dielectric (ILD) layer are formed on a substrate, and the transistor includes a gate structure and two source/drain regions. Subsequently, a cap layer is formed on the ILD layer and on the transistor, and a plurality of openings that penetrate through the cap layer and the ILD layer until reaching the source/drain regions are formed. Afterward, a conductive layer is formed to cover the cap layer and fill the openings, and a part of the conductive layer is further removed for forming a plurality of first contact plugs, wherein a top surface of a remaining conductive layer and a top surface of a remaining cap layer are coplanar, and the remaining cap layer totally covers a top surface of the gate structure.

17 Claims, 6 Drawing Sheets

(56) References Cited

U.S. PATENT DOCUMENTS

| | | |
|---|---|---|
| 6,812,145 B2 | 11/2004 | Ma |
| 6,864,177 B2 | 3/2005 | Jung |
| 6,905,968 B2 | 6/2005 | Hsieh |
| 6,924,228 B2 | 8/2005 | Kim |
| 6,930,048 B1 | 8/2005 | Li |
| 7,067,235 B2 | 6/2006 | Tsai |
| 7,176,126 B2 | 2/2007 | Oh |
| 7,544,623 B2 | 6/2009 | Chou |
| 2003/0129844 A1 | 7/2003 | Wang |
| 2006/0024951 A1 | 2/2006 | Schuehrer |
| 2006/0042651 A1 | 3/2006 | Verhaverbeke |
| 2006/0148243 A1 | 7/2006 | Wang |
| 2006/0252256 A1 | 11/2006 | Weng |
| 2006/0286793 A1 | 12/2006 | Lin |
| 2007/0020565 A1 | 1/2007 | Koh |
| 2007/0052107 A1 | 3/2007 | Weng |
| 2007/0054491 A1 | 3/2007 | Chen |
| 2007/0066047 A1 | 3/2007 | Ye |
| 2007/0077751 A1 | 4/2007 | Chen |
| 2007/0080386 A1 | 4/2007 | Huang |
| 2007/0093053 A1 | 4/2007 | Hsu |
| 2007/0111514 A1 | 5/2007 | Chen |
| 2007/0184996 A1 | 8/2007 | Weng |
| 2007/0190805 A1 | 8/2007 | Lin |
| 2007/0249165 A1 | 10/2007 | Huang |
| 2008/0121619 A1 | 5/2008 | Lin |
| 2008/0124919 A1 | 5/2008 | Huang |
| 2008/0146036 A1 | 6/2008 | Lai |
| 2008/0171433 A1 | 7/2008 | Huang |
| 2008/0292798 A1 | 11/2008 | Huh |
| 2009/0042053 A1 | 2/2009 | Lin |
| 2009/0142931 A1 | 6/2009 | Wang |
| 2009/0176378 A1 | 7/2009 | Wang |
| 2009/0283310 A1 | 11/2009 | Chen |
| 2009/0283921 A1 | 11/2009 | Wang |
| 2009/0314743 A1 | 12/2009 | Ma |
| 2010/0038687 A1 * | 2/2010 | Klaus et al. ............. 257/288 |
| 2010/0040982 A1 | 2/2010 | Liu |
| 2010/0087056 A1 | 4/2010 | Chung |
| 2010/0105205 A1 | 4/2010 | Lee |
| 2011/0101468 A1 | 5/2011 | Nakajima |
| 2011/0298017 A1 * | 12/2011 | Jain et al. ............... 257/288 |
| 2012/0045889 A1 | 2/2012 | Yeh |
| 2012/0135577 A1 | 5/2012 | Lee |

OTHER PUBLICATIONS

Chen et al., Title: Method for Forming Semiconductor Structure Having Metal Connection, pending U.S. Appl. No. 13/705,183, filed Dec. 5, 2012.

* cited by examiner

_US 8,921,226 B2_

METHOD OF FORMING SEMICONDUCTOR STRUCTURE HAVING CONTACT PLUG

BACKGROUND OF THE INVENTION

1. Field of the Invention

The present invention relates to a method of forming a semiconductor structure having at least a contact plug, and more particularly, to a method of forming a semiconductor structure having a gate structure and at least a contact plug, wherein a top surface of the contact plug is substantially higher than a top surface of the gate structure, and the top surface of the contact plug and a top surface of a cap layer formed on the gate structure are coplanar.

2. Description of the Prior Art

Poly-silicon is conventionally used as a gate electrode in semiconductor devices, such as the metal-oxide-semiconductor (MOS). However, with a trend toward scaling down the size of semiconductor devices, the conventional poly-silicon gate has faced problems such as inferior performance due to boron penetration and unavoidable depletion effect which increases equivalent thickness of the gate dielectric layer, reduces gate capacitance, and worsens a driving force of the devices. Therefore, work function metals are used to replace the conventional poly-silicon gate to be the control electrode that is suitable for the high-k gate dielectric layer.

In conventional arts, after forming the transistor with a metal gate, a wiring system is formed thereon to electrically connect the metal gate and the source/drain regions, thereby providing signal input/output pathways for the transistor. The wiring system includes a plurality of contact plugs, and the double patterning technique (DPT) has been developed and taken as one of the most promising lithographic technologies to overcome the limitations of the conventional tools for forming complicated and intensive patterns. In other words, multiple photolithography processes are required to be performed during the conventional contact plug processes, therefore, the cleaning solution, the etchant or the chemical solvent used in the photolithography processes may directly contact the exposed metal gates, which may deform or damage the formed metal gates. Consequently, how to avoid the effects caused by the later processes and maintain the normal function of the metal gates is still an important issue in the field.

SUMMARY OF THE INVENTION

It is therefore one of the objectives of the present invention to provide a method of forming a semiconductor structure having at least a contact plug in order to improve the overall electrical performance of the semiconductor structure.

According to one exemplary embodiment of the present invention, a method of forming a semiconductor structure having at least a contact plug includes the following steps. At first, at least a transistor and an inter-layer dielectric (ILD) layer are formed on a substrate, and the transistor includes a gate structure and two source/drain regions. Subsequently, a cap layer is formed on the ILD layer and on the transistor, and a plurality of openings that penetrate through the cap layer and the ILD layer until reaching the source/drain regions are formed. Afterward, a conductive layer is formed to cover the cap layer and fill the openings, and a part of the conductive layer is further removed for forming a plurality of first contact plugs, wherein a top surface of a remaining conductive layer and a top surface of a remaining cap layer are coplanar, and the remaining cap layer totally covers a top surface of the gate structure.

The gate structure is totally covered by the cap layer during the formation of the first contact plugs which are electrically connected to the source/drain regions in order to avoid the effects caused by the manufacturing process of the first contact plugs. For example, the gate structure may not contact the cleaning solution, the etchant or the chemical solvent used in the multiple photolithography processes for forming the openings, in order to maintain the material properties of the gate structure. Furthermore, the method of forming the first contact plugs includes sequentially forming the first openings on the source/drain region at a side of the gate structure and forming the second openings on the source/drain region at another side of the gate structure in order to obtain the precise positions of the first contact plugs.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail. The preferred exemplary embodiments of the present invention are illustrated in the accompanying drawings with numbered elements.

Figure 1:
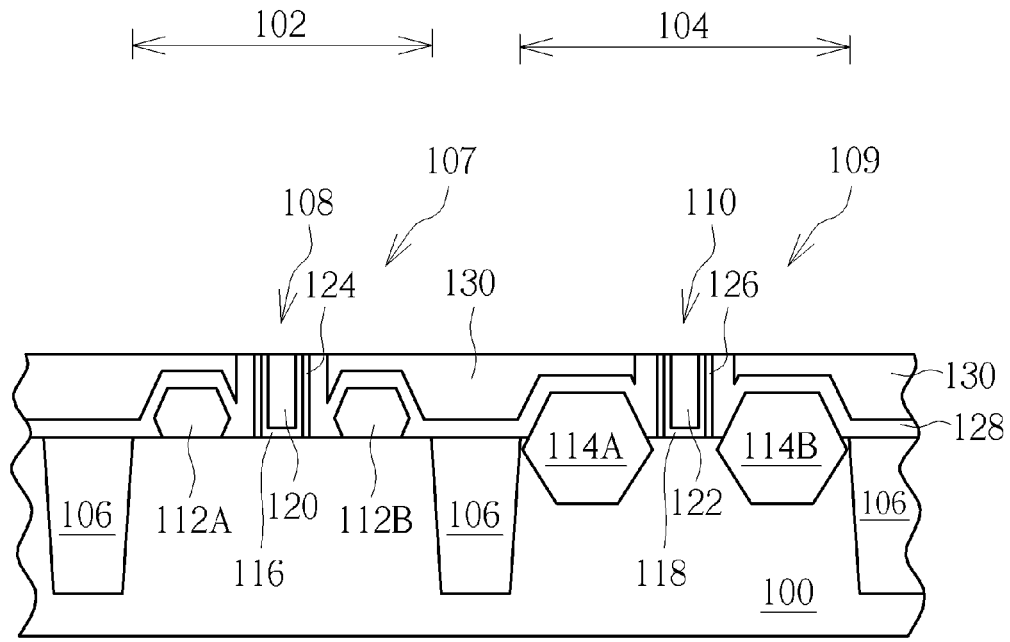
FIG. 1 through FIG. 11 illustrate a method of forming a semiconductor structure having at least a contact plug according to a preferred exemplary embodiment of the present invention.

Please refer to FIG. 1 through FIG. 11, which illustrate a method of forming a semiconductor structure having at least a contact plug according to a preferred exemplary embodiment of the present invention. As shown in FIG. 1, a substrate 100 is provided, and the substrate 100 includes at least two active regions 102/104. Furthermore, a plurality of shallow trench isolations (STI) 106 are formed in the substrate 100. The substrate 100 can be a silicon substrate, an epitaxial silicon substrate, a silicon germanium substrate, a silicon carbide substrate or a silicon-on-insulator (SOI) substrate, but is not limited thereto. The STI 106 may include dielectric materials such as silicon oxide. As the STI processes are known to those skilled in the art, the details are omitted herein for brevity.

At least a transistor 107/109 and an inter-layer dielectric (ILD) layer 130 are further formed on the substrate 100. Each of the transistors 107/109 respectively includes a gate structure 108/110 and two source/drain regions 112A/112B/114A/114B. Each of the gate structures 108/110 respectively includes a gate dielectric layer 116/118 and a metal gate 120/122, and two source/drain regions 112A/112B/114A/114B are respectively disposed at two sides of the gate structure 108/110. The present invention may be applied in various metal gate processes including a gate-first process, a high-k first process integrated into the gate-last process, and a high-k last process integrated into the gate-last process. In this exemplary embodiment, the transistors 107/109 formed through the high-k last process integrated into the gate-last process are taken for example. The gate dielectric layer 116/118 including a high-k dielectric layer has a "U-shaped" cross section, and the gate dielectric layer 116/118 could be made of dielectric materials having dielectric constant (k value) larger than 4. Furthermore, a dielectric layer (not shown) such as a silicon oxide layer can be selectively formed between the substrate 100 and the gate dielectric layer 116/118. The metal gate 120/122 contains one or a plurality of metal layers, for example, a work function metal layer, a barrier layer and a low-resistance metal layer. The method of forming the gate structure 108/110 and the ILD layer 130 may include the following steps. At first, at least a dummy gate (not shown) is formed on the substrate 100, and then a spacer 124/126, the source/drain regions 112A/112B/114A/114B, a contact etch stop layer (CESL) 128 and the ILD layer 130 are sequentially formed on the substrate 100. The ILD layer 130 can be made of dielectric materials through a spin-on-coating (SOC) process, a chemical vapor deposition (CVD) process or other suitable process, and the dielectric materials include low dielectric constant (low-k) material (k value smaller than 3.9), ultra low-k (ULK) material (k value smaller than 2.6), or porous ULK material, but is not limited thereto. Next, a planarization process is performed on the ILD layer 130 to expose the dummy gate, and then the dummy gate is partially removed to form a trench (not shown). Moreover, at least a dielectric material layer (not shown) and at least a metal material layer (not shown) are sequentially filled with the trench, and a chemical mechanical polishing (CMP) process is further performed to remove the dielectric material layer and the metal material layer outside the trench. Accordingly, the gate structure 108/110 including the gate dielectric layer 116/118 and the metal gate 120/122 can be formed, and a top surface of the ILD layer 130 and a top surface of the gate structure 108/110 are coplanar.

It is appreciated that, each component of the transistors 107/109 can have different embodiments according to different designs of the devices. For example, the source/drain regions 112A/112B/114A/114B can include an epitaxial layer formed by a selective epitaxial growth (SEG) process, wherein the epitaxial layer can be directly formed on the substrate 100 such as the source/drain regions 112A/112B in the active region 102, or recesses are previously formed at two sides of the gate structure 108/110 and epitaxial layer is further formed to fill the recesses such as the source/drain regions 114A/114B in the active region 104, in order to provide stress to the channel region underneath the gate structure 108/110. In this exemplary embodiment, as the transistor 107 serves as NMOS, the epitaxial layer in the source/drain regions 112A/112B can be made of SiP or SiC to provide tensile stress to the channel region. Furthermore, as the transistor 109 serves as PMOS, the epitaxial layer in the source/drain regions 114A/114B can be made of SiGe to provide compressive stress to the channel region, but is not limited thereto. A top surface of the epitaxial layer is preferably above an original surface of the substrate 100. In other words, the epitaxial layers of the source/drain regions 112A/112B/114A/114B preferably extend upwardly from the substrate 100, and may extend downwardly into the substrate 100 even under the spacer 124/126 according to the process requirements, in order to provide more stress to the channel region. Additionally, a dry etching process, a wet etching process or a combination thereof can be performed to form the recesses in various types of shapes, for example, a barrel shaped recess, a hexagonal recess or an octagonal recess. Therefore, the epitaxial layer later formed in such recesses may have a hexagonal (also called "sigma Σ") or an octagonal cross section, in which a flat bottom surface of the epitaxial layer is disposed in the substrate 100 to further enhance the stress effect on the channel region.

Figure 2:
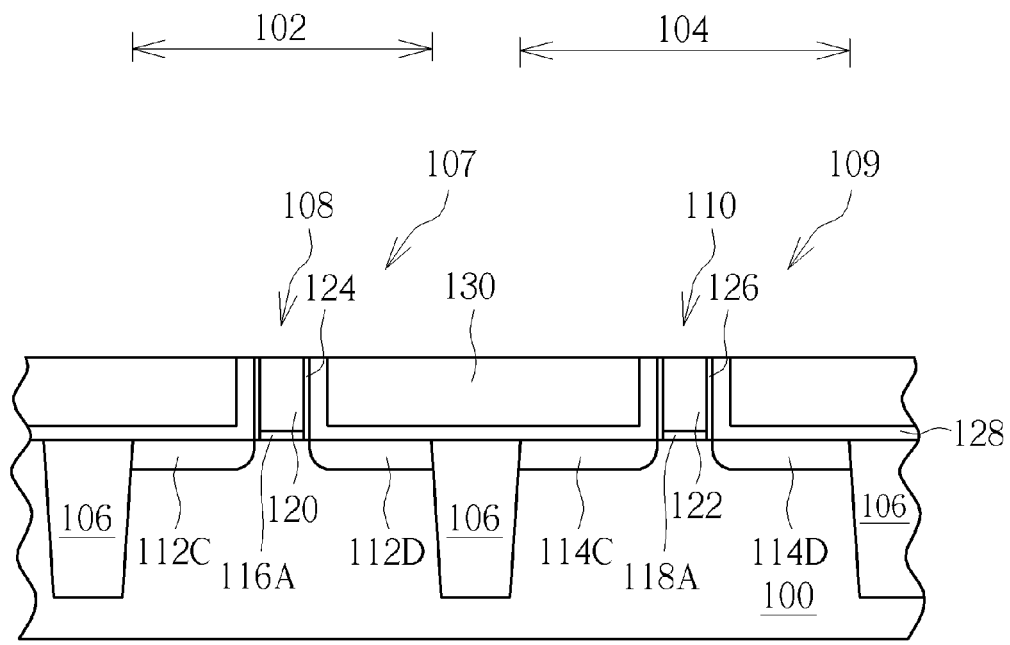

In another exemplary embodiment, as shown in FIG. 2, the gate dielectric layer 116A/118A is formed by a "high-k first" process (that is, the gate dielectric layer is formed before the dummy gate) and therefore has a "—" shape in its cross section, which is different from the "U" shape of the embodiment in FIG. 1, which is formed by a "high-k last" process (that is, the gate dielectric layer is formed after removing the dummy gate). In other aspect, the source/drain regions 112C/112D/114C/114D may include the doped source/drain regions formed through ion implantation process, and the shapes of the source/drain regions 112C/112D/114C/114D can be modified according to the stress which is predetermined to provide to the channel region. Moreover, the CESL 128 can also provide a stress. The embodiments illustrated above are only shown for example. The transistor in the present invention can have a variety of embodiments, which are not described for the sake of simplicity. The following description is based on the transistors 107/109 of the embodiment shown in FIG. 1.

Figure 3:
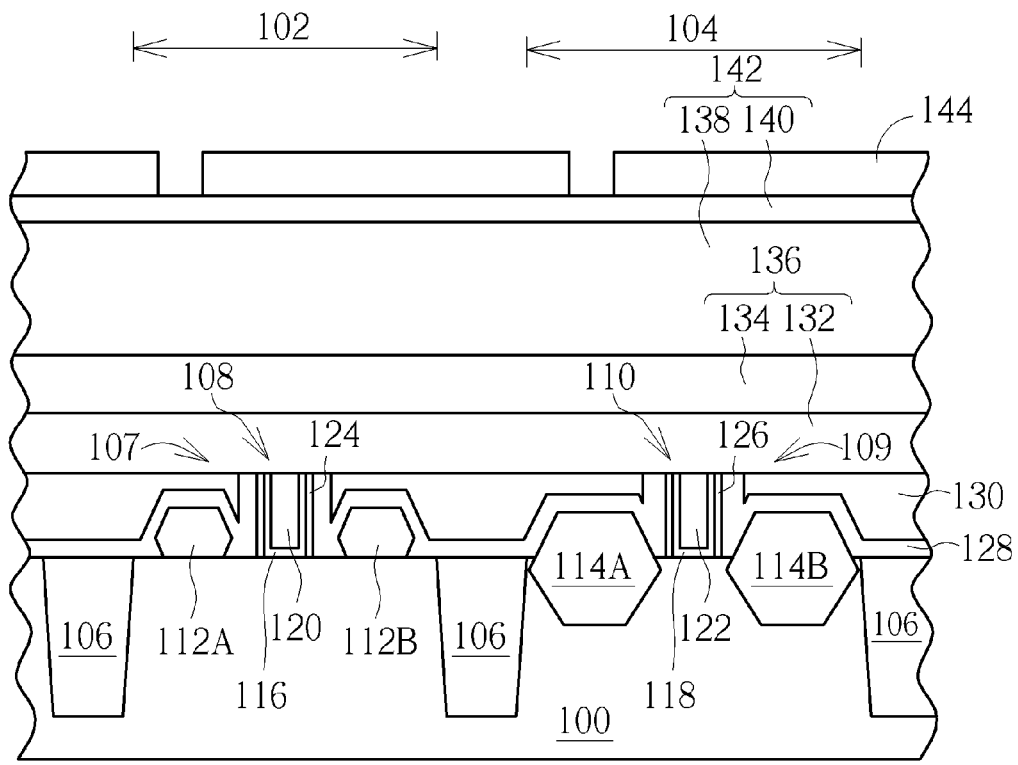

As shown in FIG. 3, a cap layer 136 is formed on the ILD layer 130 and on the transistors 107/109, and the cap layer 136 simultaneously contact the ILD layer 130 and the gate structure 108/110. The cap layer 136 may have a single layer or multiple layers, and a material of the cap layer 136 includes dielectric materials such as silicon oxide, silicon nitride, silicon carbide, doped silicon carbide, silicon oxynitride or a combination thereof. The method of forming the cap layer 136 includes sequentially forming a first cap layer 132 and a second cap layer 134 on the ILD layer 130, wherein a material of the first cap layer 132 is substantially different from a material of the second cap layer 134. In other words, the first cap layer 132 and the second cap layer 134 may have etching selectivity, more specifically, as the same etchant or slurry is used to remove the first cap layer 132 and the second cap layer 134, a removing rate of the first cap layer 132 is substantially different from a removing rate of the second cap layer 134. In this exemplary embodiment, the first cap layer 132 is made of nitrogen doped silicon carbide (NDC), silicon nitride (SiN) or silicon carbonitride (SiCN), while the second cap layer 134 is made of oxide, and a removing rate of the second cap layer 134 is substantially larger than a removing rate of the first cap layer 132, but is not limited thereto.

Subsequently, a plurality of openings that penetrate through the cap layer 136 and the ILD layer 130 until reaching the source/drain regions 112A/112B/114A/114B are formed. The method of forming the openings includes the following steps. At first, please refer to FIG. 3 again, as shown in FIG. 3, a first mask layer 142 and a first patterned photoresist layer 144 are formed on the cap layer 136, and the first patterned photoresist layer 144 and the first mask layer 142 can have different embodiments depending on the process technology. For example, the first patterned photoresist layer 144 could be made of photoresist materials suitable for light source having a wavelength of 193 nm or 248 nm such as KrF photoresist layer, and a bottom anti-reflective coating (BARC) (not shown) can be selectively formed under the first patterned photoresist layer 144. The first mask layer 142 may be one single layer or multi layers, which are made of various kinds of hard mask materials, such as silicon nitride (SiN), silicon oxynitride (SiON), silicon carbide (SiC) or non-amorphous carbon-containing organic material such as Advanced pattern film APF© sold by Applied Material Inc. In this exemplary embodiment, the first patterned photoresist layer 144 includes the pattern used to define the first opening, and the first mask layer 142 disposed directly under the first patterned photoresist layer 144 has multi layers, i.e. the first mask layer 142 includes an organic dielectric layer (ODL) 138 and a silicon-containing hard mask (SHB) layer 140. The ODL 138 is mainly made of 365 nm I-line PR or novolac resin, and the SHB layer 140 is mainly made of organo-silicon polymers or polysilane including at least a chromophore group and a crosslinkable group, and a cross-linking agent may be further included in the SHB layer 140, therefore, after the exposure process, a cross-link reaction is induced in the SHB layer 140.

Figure 4:
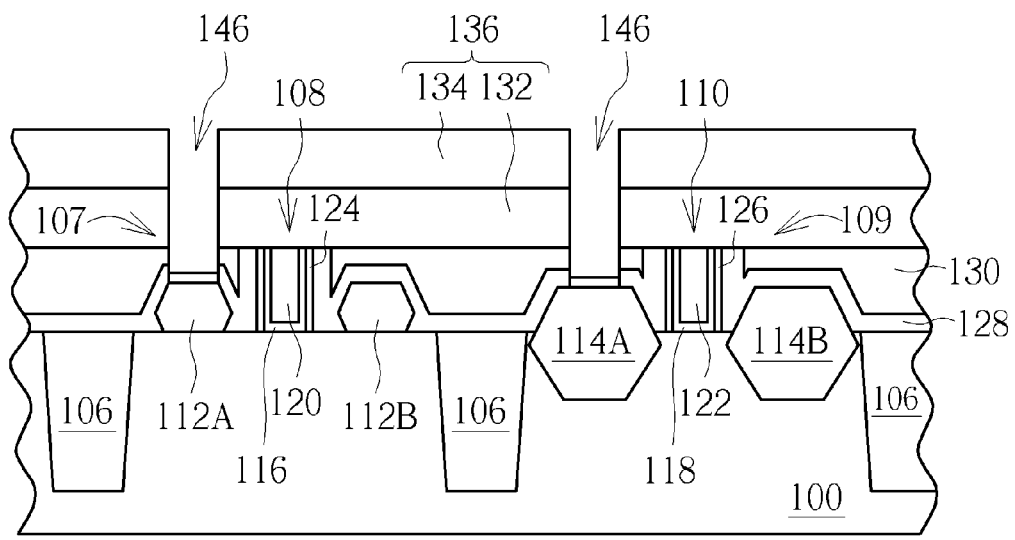

As shown in FIG. 4, the first patterned photoresist layer 144 may serve as a mask, and a first etching process is performed to remove a part of the first mask layer 142, a part of the cap layer 136, a part of the ILD layer 130 and a part of the CESL 128 in order to form at least a first opening 146, and stop at the CESL 128. The first openings 146 only overlap the source/drain regions 112A/114A at a side of the gate structure 108/110, while the gate structures 108/110 and the source/drain regions 112B/114B at another side of the gate structure 108/110 are still covered by the cap layer 136. Moreover, a part of the CESL 128 may be damaged due to over etching, therefore, a thickness of the CESL 128 at the bottom of the first opening 146 may be lower than an original thickness of the CESL 128. Then, the first patterned photoresist layer 144 and the first mask layer 142 are removed.

Figure 5:
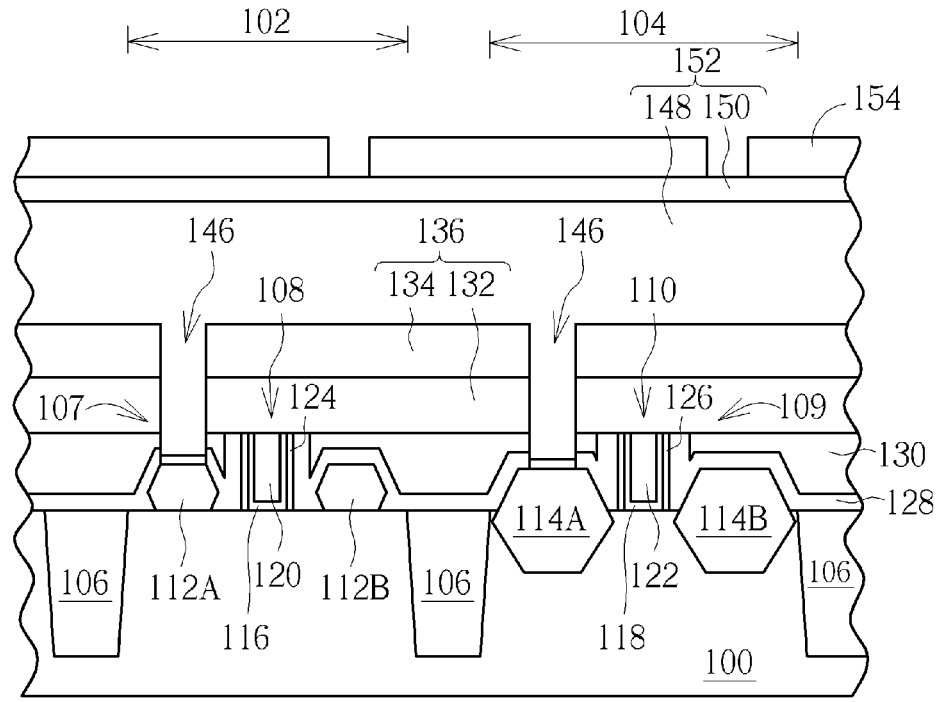
Figure 6:
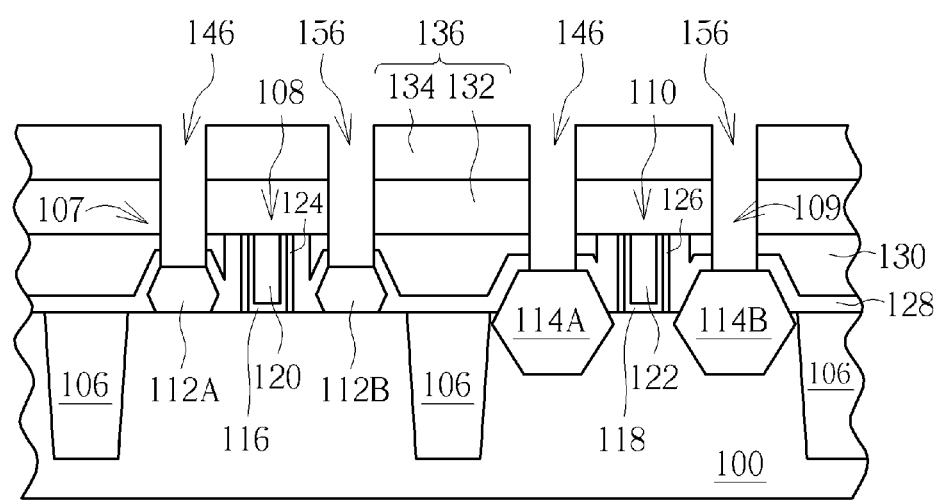

As shown in FIG. 5, a second mask layer 152 and a second patterned photoresist layer 154 are formed on the cap layer 136, and the second patterned photoresist layer 154 and the second mask layer 152 can have different embodiments depending on the process technology, which may be the same as that of the first patterned photoresist layer 144 and the first mask layer 142 or not. In this exemplary embodiment, the second patterned photoresist layer 154 includes the pattern used to define the second opening, and the second mask layer 152 disposed directly under the second patterned photoresist layer 154 has multi layers, which is the same as the first mask layer 142, i.e. the second mask layer 152 also includes an organic dielectric layer (ODL) 148 and a silicon-containing hard mask (SHB) layer 150, and the formed first openings 146 can be completely filled by the ODL layer 148 due to the good filling capability of the ODL layer 148. Subsequently, as shown in FIG. 6, the second patterned photoresist layer 154 may serve as a mask, and a second etching process is performed to remove a part of the second mask layer 152, a part of the cap layer 136, a part of the ILD layer 130 and a part of the CESL 128 in order to form at least a second opening 156. The second openings 156 only overlap the source/drain regions 112B/114B at another side of the gate structure 108/110, while the gate structures 108/110 are still covered by the cap layer 136. Accordingly, the gate structures 108/110 of the transistors 107/109 are not exposed by the first openings 146 and the second openings 156 during the first etching process and the second etching process. Then, the second patterned photoresist layer 154 and the second mask layer 152 are removed, and the CESL 128 at the bottoms of the first openings 146 and the second openings 156 are removed, accordingly, the method of forming the openings is completed.

Each of the first openings 146 and the second openings 156 is not limited to a single opening, in other words, the first openings 146 and the second openings 156 may respectively include a plurality of individual openings or an elongate slot. The slot can elongate along a direction parallel to a direction the gate structure 108/110 elongate, i.e. the direction perpendicular to the surface of the paper, on the source/drain region 112A/112B/114A/114B, in which the slot preferably elongates on the overall source/drain region 112A/112B/114A/114B, in order to increase the contacting surface between the later formed contact plug and the source/drain region 112A/112B/114A/114B and reduce the resistance. In other words, the size, the shape, the number, or the layout of the openings can be modified according to process requirements.

Figure 7:
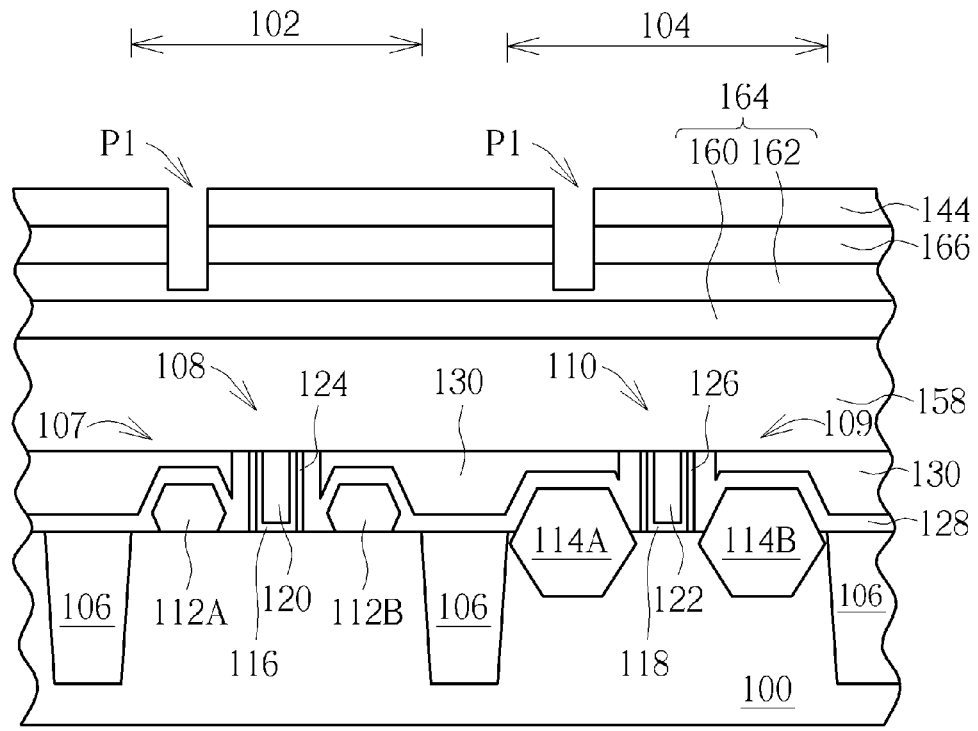
Figure 8:
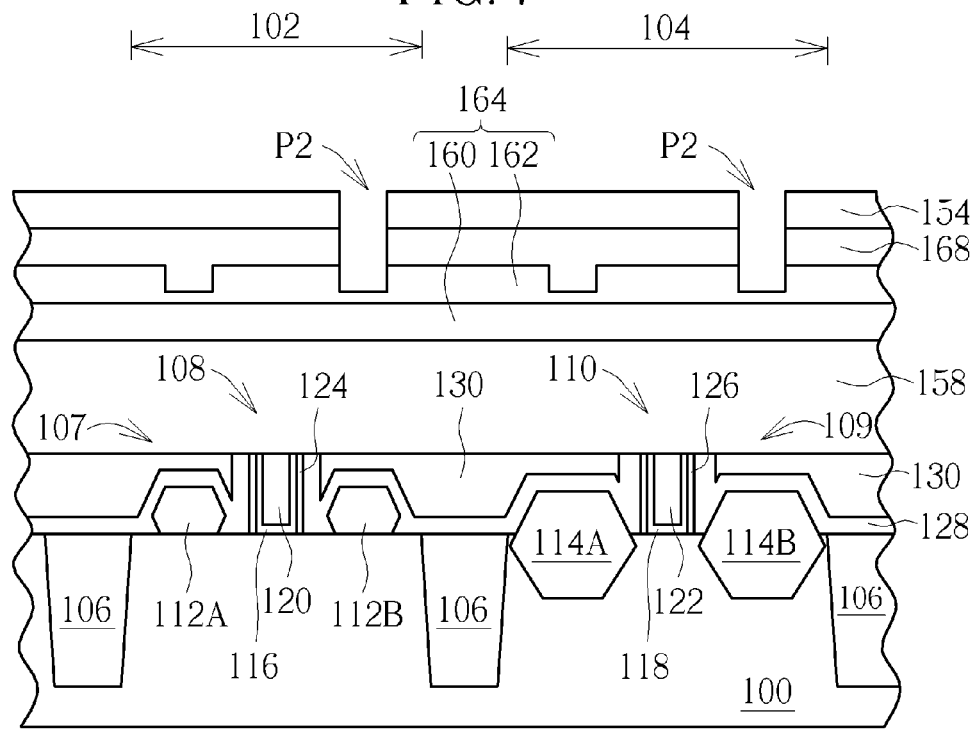

In addition, the method of forming a plurality of the openings is not limited to the illustrated embodiment. In other exemplary embodiment, as any of the intervals between the openings is larger than the smallest distance between the patterns that could be resolved through exposure process and development process, a single mask and a patterned photoresist layer can be used to perform a photolithography process to simultaneously define a plurality of openings, in stead of forming openings by the separate processes. In another exemplary embodiment, the method of forming the openings may include the following steps. As shown in FIG. 7, a mask layer 164, a first bottom anti-reflective coating (BARC) 166 and the first patterned photoresist layer 144 are formed on a cap layer 158. The cap layer 158 may include a single layer or multi layers. The mask layer 164 includes an advanced patterning film (APF) 160 such as amorphous carbon layer and a dielectric anti-reflective coating (DARC) layer 162, wherein the APF 160 has a high aspect ratio (HAR), low line edge roughness (LER) and PR-like ashability, so that it is widely used in semiconductor processes with line width smaller than 60 nm. Subsequently, the first patterned photoresist layer 144 may serve as a mask, and the pattern of the first patterned photoresist layer 144, i.e. the pattern used to define the first opening, is transferred into the DARC layer 162. Then, the first patterned photoresist layer 144 and the first BARC 166 are removed. Afterward, as shown in FIG. 8, a second bottom anti-reflective coating (BARC) 168 and the second patterned photoresist layer 154 are formed on the mask layer 164, and the second patterned photoresist layer 154 may serve as a mask to transfer the pattern of the second patterned photoresist layer 154, i.e. the pattern used to define the second opening into the DARC layer 162. Then, the second patterned photoresist layer 154 and the second BARC 168 are removed. Meanwhile, the mask layer 164 simultaneously includes the first opening pattern P1 and the second opening pattern P2, i.e. the pattern of a plurality of openings within the DARC layer 162. These opening patterns do not expose the underneath APF 160, and an interval between the first opening pattern P1 and the second opening pattern P2 could be smaller than the exposure limit of the corresponding lithography process, i.e. the smallest distance between the patterns that could be resolved through exposure process and development process. Moreover, at least two patterning processes are performed to transfer the opening patterns (the first opening pattern P1 and the second opening pattern P2) into the cap layer 158 and the ILD layer 130, and the first openings 146 and the second openings 156 as shown in FIG. 6 can be formed. More specifically, the DARC layer 162 is firstly used as a mask, and a first patterning process is performed to transfer the opening patterns into the APF 160, and a part of the cap layer 158 is exposed. Then, the DARC layer 162 and the APF 160 are jointly used as a mask, and a second patterning process is performed to simultaneously form a plurality of the openings, i.e. the first openings 146 and the second openings 156 in the cap layer 158 and the ILD layer 130. Similarly, the first openings 146 and the second openings 156 only overlap the source/drain regions 112A/112B/114A/114B without exposing the gate structures 108/110, and the CESL 128 exposed at the bottoms of the first openings 146 and the second openings 156 are later removed, in which the gate structures 108/110 are totally covered and protected by the cap layer 158 during the illustrated patterning processes.

Figure 9:
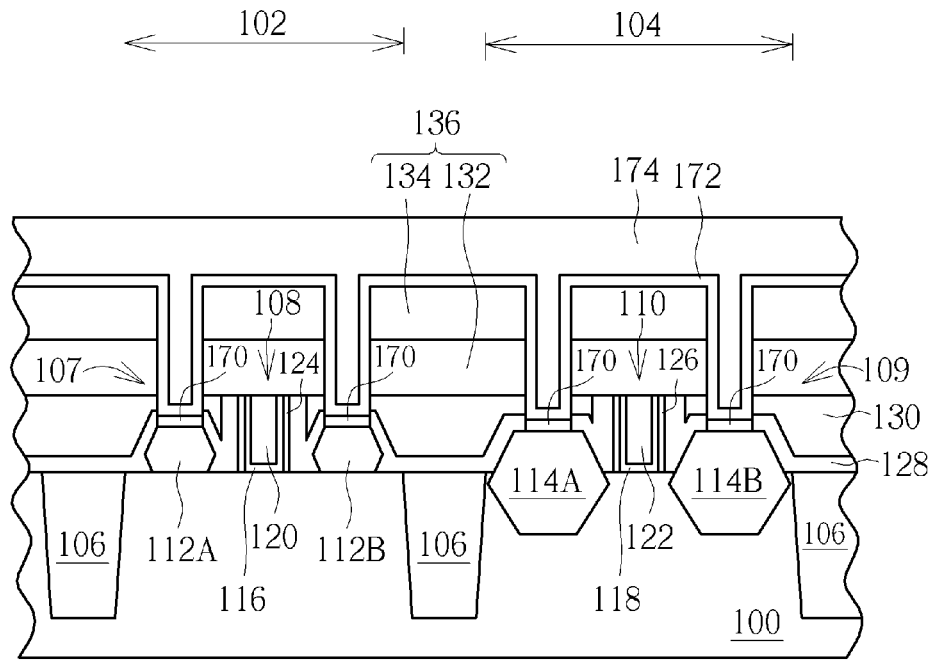

As shown in FIG. 9, after forming the openings, a cleaning process can optionally be performed. For example, argon (Ar) gas is used to clean the surfaces of the first openings 146 and the second openings 156. Furthermore, a self-aligned metal silicide (salicide) process can be performed to form a metal silicide layer 170 such as a nickel silicide (NiSi) layer on each of the source/drain regions 112A/112B/114A/114B exposed by the first openings 146 and the second openings 156. In other exemplary embodiments, as the metal silicide layer has been formed on the source/drain regions before forming the openings, this salicide process can be omitted.

Subsequently, a plurality of first contact plugs are formed in the first openings 146 and the second openings 156. The steps of forming the first contact plugs are illustrated below. Please refer to FIG. 9 again, as shown in FIG. 9, a barrier/adhesive layer 172, a seed layer (not shown) and a conductive layer 174 sequentially formed on the substrate 100 cover the cap layer 136 and fill the first openings 146 and the second openings 156. The barrier/adhesive layer 172 is formed conformally along the surfaces of the first openings 146 and the second openings 156, and the conductive layer 174 completely fills the first openings 146 and the second openings 156. The barrier/adhesive layer 172 could be used for preventing metal elements of the conductive layer 174 from diffusing into the neighboring ILD layer 130, and the barrier/adhesive layer 172 can also increase the adhesion between the conductive layer 174 and the ILD layer 130. A material of the barrier/adhesive layer 172 can include tantalum (Ta), titanium (Ti), titanium nitride (TiN) or tantalum nitride (TaN) or a suitable combination of metal layers such as Ti/TiO, but is not limited thereto. A material of the seed layer is preferably the same as a material of the conductive layer 174, and a material of the conductive layer 174 can include a variety of low-resistance metal materials, such as aluminum (Al), titanium (Ti), tantalum (Ta), tungsten (W), niobium (Nb), molybdenum (Mo), copper (Cu) or the like, preferably tungsten or copper, and most preferably tungsten, which can form suitable Ohmic contact between the conductive layer 174 and the metal silicide layer 170 or the below source/drain regions 112A/112B/114A/114B.

Figure 10:
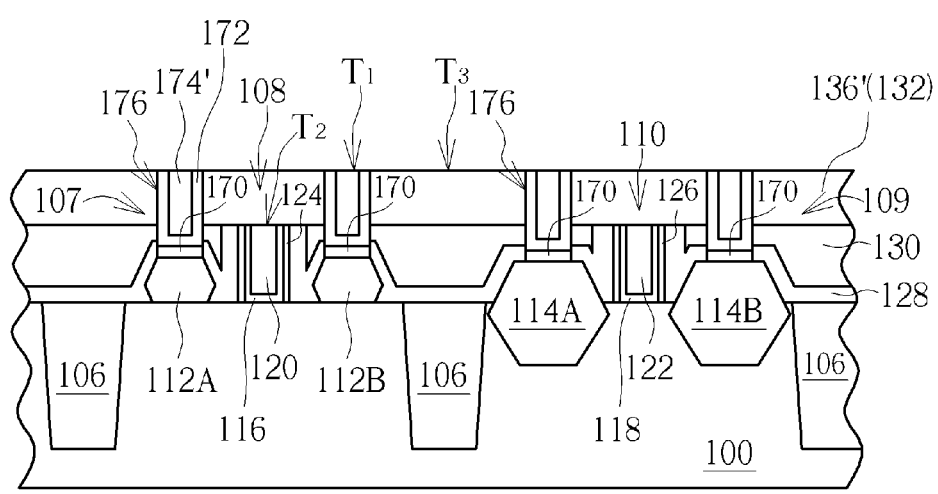

As shown in FIG. 10, a planarization step, such as a chemical mechanical polish (CMP) process or an etching back process or their combination, can be performed to remove the barrier/adhesive layer 172, the seed layer and the conductive layer 174 outside the first openings 146 and the second openings 156, and further remove a part of the cap layer 136. Accordingly, a top surface of a remaining conductive layer 174' and a top surface of a remaining cap layer 136' are coplanar, and a plurality of the first contact plugs 176 i.e. the source/drain region contact plugs are completed, wherein the remaining cap layer 136' still totally covers a top surface of the gate structure 108/110. It is appreciated that, the material of the first cap layer 132 is substantially different from the material of the second cap layer 134, therefore, the first cap layer 132 can serve as a etch stop layer, while the second cap layer 134 is totally removed, and a top surface T1 of the formed first contact plug 176 is located in the first cap layer 132. More specifically, the top surface T1 of each of the first contact plugs 176 is substantially higher than the top surface T2 of the gate structure 108/110, and the top surface T1 of each of the first contact plugs 176 and the top surface T3 of the remaining cap layer 136' are coplanar.

In other exemplary embodiment, as the cap layer 136 is a single layered structure, the thickness of the cap layer 136 to be removed can be modulated by a time mode, for example, by adjusting the process conditions such as the processing time of the planarization process, in order to make the top surface of the remaining conductive layer 174' and the top surface of the remaining cap layer 136' coplanar.

Figure 11:
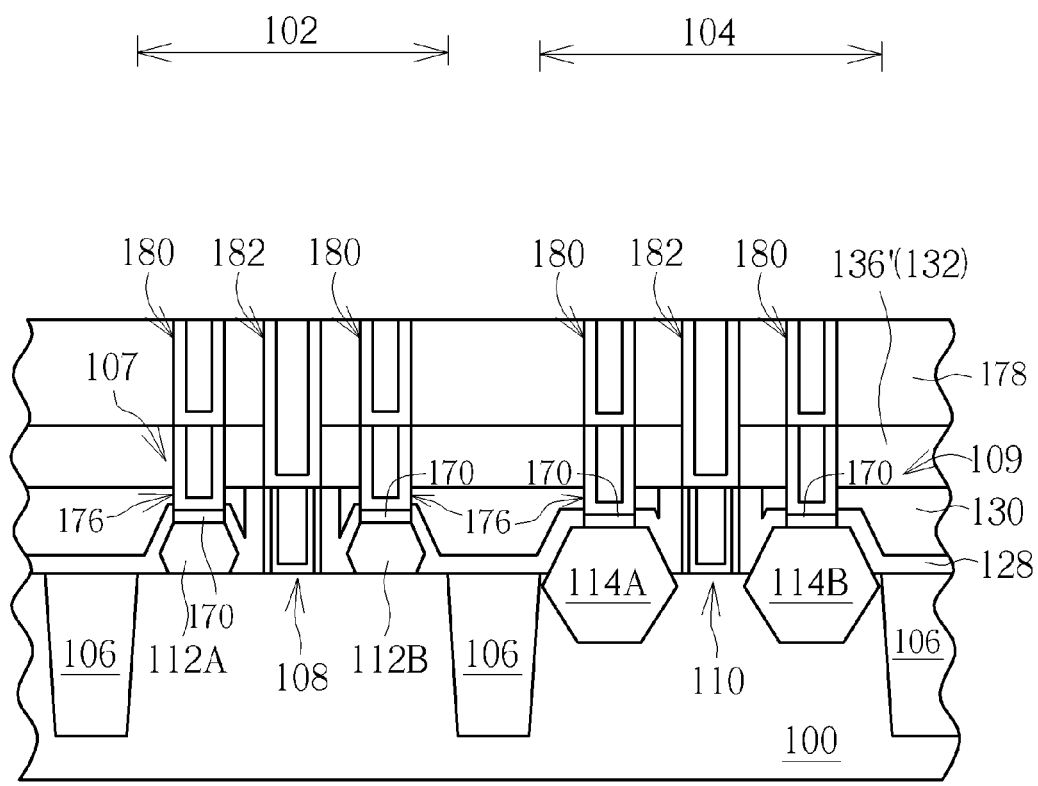

As shown in FIG. 11, after forming the first contact plugs 176, a dielectric layer 178 is further formed on the remaining cap layer 136', a plurality of second contact plugs 180 are formed in the dielectric layer 178 to respectively electrically connect to each of the first contact plugs 176, and at least a third contact plug 182 is formed in the dielectric layer 178 and the remaining cap layer 136' to electrically connect to the gate structure 108/110. Furthermore, a conventional metal interconnection fabrication method can be performed. Therefore, a metal interconnect system (not shown), which includes a plurality of inter-metal dielectric (IMD) layers and a plurality of metal layers (so called metal 1, metal 2, and the like), can be further formed above the dielectric layer 178. The metal interconnection system electrically connects the gate structure 108/110 of the transistor 107/109 by the third contact plug 182 and electrically connects the source/drain regions 112A/112B/114A/114B of the transistor 107/109 by the first contact plug 176 and the second contact plugs 180, thereby providing a signal input/output pathway for the transistor 107/109.

In conclusion, the gate structure is totally covered by the cap layer during the formation of the first contact plugs which are electrically connected to the source/drain regions in order to avoid the effects caused by the manufacturing process of the first contact plugs. For example, the gate structure may not contact the cleaning solution, the etchant or the chemical solvent used in the multiple photolithography processes for forming the openings, in order to maintain the material properties of the gate structure. Furthermore, the method of forming the first contact plugs includes sequentially forming the first openings on the source/drain region at a side of the gate structure and forming the second openings on the source/drain region at another side of the gate structure in order to obtain the precise positions of the first contact plugs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure having at least a contact plug, comprising:
    forming at least a transistor and an inter-layer dielectric (ILD) layer on a substrate, wherein the transistor comprises a gate structure and two source/drain regions;
    forming a cap layer on the ILD layer and on the transistor;
    forming a plurality of openings penetrating through the cap layer and the ILD layer until reaching the source/drain regions;
    forming a conductive layer covering the cap layer and filling the openings; and
    removing a part of the conductive layer for forming a plurality of first contact plugs, wherein a top surface of a remaining conductive layer and a top surface of a remaining cap layer are coplanar, and the remaining cap layer directly contacts a gate electrode of the gate structure.

2. The method of forming a semiconductor structure having at least a contact plug according to claim 1, wherein a material of the cap layer comprises dielectric materials.

3. The method of forming a semiconductor structure having at least a contact plug according to claim 1, wherein the method of forming the cap layer comprises sequentially forming a first cap layer and a second cap layer on the ILD layer.

4. The method of forming a semiconductor structure having at least a contact plug according to claim 3, wherein after removing a part of the conductive layer, the remaining cap layer only comprises the first cap layer.

5. The method of forming a semiconductor structure having at least a contact plug according to claim 3, wherein a material of the first cap layer is substantially different from a material of the second cap layer.

6. The method of forming a semiconductor structure having at least a contact plug according to claim 1, further comprising forming a contact etch stop layer (CESL) covering the transistor before forming the ILD layer.

7. The method of forming a semiconductor structure having at least a contact plug according to claim 1, further comprising performing a planarization process on the ILD layer before forming the cap layer.

8. The method of forming a semiconductor structure having at least a contact plug according to claim 7, wherein after performing the planarization process on the ILD layer, a top surface of the ILD layer and the top surface of the gate structure are coplanar, and the cap layer simultaneously contacts the ILD layer and the gate structure.

9. The method of forming a semiconductor structure having at least a contact plug according to claim 1, wherein the openings do not expose the gate structure of the transistor.

10. The method of forming a semiconductor structure having at least a contact plug according to claim 1, wherein the method of forming the openings comprises forming at least a first opening before forming at least a second opening.

11. The method of forming a semiconductor structure having at least a contact plug according to claim 10, wherein the first opening exposes the source/drain region at a side of the gate structure, and the second opening exposes the source/drain region at another side of the gate structure.

12. The method of forming a semiconductor structure having at least a contact plug according to claim 1, before forming the conductive layer covering the cap layer and filling the openings, further comprising performing a self-aligned metal silicide process to respectively form a metal silicide layer on each of the source/drain regions.

13. The method of forming a semiconductor structure having at least a contact plug according to claim 1, wherein the gate structure comprises a gate dielectric layer and a metal gate.

14. The method of forming a semiconductor structure having at least a contact plug according to claim 13, wherein the metal gate comprises a work function metal layer, a barrier layer and a low-resistance metal layer.

15. The method of forming a semiconductor structure having at least a contact plug according to claim 1, wherein a top surface of each of the first contact plugs is substantially higher than the top surface of the gate structure, and the top surface of each of the first contact plugs and the top surface of the remaining cap layer are coplanar.

16. The method of forming a semiconductor structure having at least a contact plug according to claim 1, wherein each of the source/drain regions comprises an epitaxial layer, and a top surface of the epitaxial layer is above an original surface of the substrate.

17. The method of forming a semiconductor structure having at least a contact plug according to claim 1, further comprising:
    forming a dielectric layer on the remaining cap layer;
    forming a plurality of second contact plugs in the dielectric layer, wherein the second contact plugs respectively electrically connect to each of the first contact plugs; and
    forming at least a third contact plug in the dielectric layer and the remaining cap layer, wherein the third contact plug electrically connects to the gate structure.

* * * * *